United States Patent

Ando et al.

[11] Patent Number: 4,670,672
[45] Date of Patent: Jun. 2, 1987

[54] C-MOS LOGIC CIRCUIT SUPPLIED WITH NARROW WIDTH PULSES CONVERTED FROM INPUT PULSES

[75] Inventors: Tsuyoshi Ando; Yasunobu Okano, both of Tokyo, Japan

[73] Assignee: NEC Corporation, Tokyo, Japan

[21] Appl. No.: 694,174

[22] Filed: Jan. 23, 1985

[30] Foreign Application Priority Data

Jan. 23, 1984 [JP] Japan .................. 59-10462

[51] Int. Cl.[4] .................. H03K 17/16; H03K 19/003; H03K 19/096
[52] U.S. Cl. .................. 307/443; 307/200 B; 307/452; 307/481; 307/240; 307/265; 307/266; 307/267
[58] Field of Search .................. 307/200 B, 442, 443, 307/448, 452, 481, 518, 353, 240, 261, 265–267; 328/58

[56] References Cited

U.S. PATENT DOCUMENTS 3,862,440 1/1975 Suzuki et al. ............ 307/266
3,867,648 2/1975 Christenson ............ 307/266
3,937,982 2/1976 Nakajima ............ 307/481 X
4,047,057 9/1977 Ahmed ............ 307/266 X
4,370,569 1/1983 Hunsinger ............ 307/266

Primary Examiner—Stanley D. Miller
Assistant Examiner—D. R. Hudspeth
Attorney, Agent, or Firm—Sughrue, Mion, Zinn, Macpeak, and Seas

[57] ABSTRACT

A logic circuit comprises an input terminal receiving an input signal of input pulses; first and second stages of C-MOS circuit formed by a first MOS FET of one channel type formed in said semiconductor substrate of one conductivity type and a second MOS FET of other channel type formed in well region of other conductivity type formed in the semiconductor substrate, said first and second stages being connected in a cascade connection; a first power terminal applying a first power voltage to the semiconductor substrate; a second power terminal applying a second power voltage to the well region; and a pulse converter converting the input signal to a pulse signal having a reference voltage of the second power voltage and short width pulses of the first power voltage produced in synchronism with the input pulses.

15 Claims, 5 Drawing Figures

4,670,672

C-MOS LOGIC CIRCUIT SUPPLIED WITH NARROW WIDTH PULSES CONVERTED FROM INPUT PULSES

BACKGROUND OF THE INVENTION

1. Field of the Invention:

The present invention relates to a logic circuit using a complementary type MOS circuit (hereinafter, referred to as a C-MOS circuit) which is formed of a P-channel MOS field effect transistor (hereinafter, referred to as a P-MOS FET) and an N-channel MOS field effect transistor (hereinafter, referred to as an N-MOS FET), and more particularly to an improvement for preventing malfunctions due to noise superposed on power voltage.

2. Description of the Prior Art:

The C-MOS circuits have a basic construction such that a P-MOS FET and an N-MOS FET are connected in series between power voltage terminals. This basic C-MOS circuit has a feature of very small power consumption, and, therefore, have been widely used in many logic circuits. According to one of such logic circuits, an input signal is processed in several stages of circuit blocks using the basic C-MOS circuit.

The logic circuits are generally formed in an N-type silicon substrate. The N-MOS FET's are formed in a P-well region formed in the silicon substrate, while the P-MOS FET's are directly formed in the silicon substrate. A power voltage $V_{DD}$ is applied to the back surface of the silicon substrate. Another power voltage $V_{SS}$ is applied to a portion of the P-well on the upper surface of the silicon substrate, causing a resistance based on the lateral component of the P-well and inserted in series between the N-MOS FET and the power voltage $V_{SS}$. Here, a resistance based on the vertical component of the silicon substrate is negligibly small. If the P-well resistance in the fore stage of circuit blocks is larger than that in the following stage, the circuit may produce malfunctions in response to noise superposed on the power voltage $V_{SS}$.

The malfunctions will now be explained. It is assumed that when the output of the force stage is on low level of the power voltage $V_{SS}$, the power voltage $V_{SS}$ lowers suddenly by a noise. In the transition period of voltage, the source voltage of the N-MOS FET in the fore stage becomes higher than the source voltage of the N-MOS FET in the following stage. As a result, the voltage of the output of the fore stage, that is, the voltage of the input voltage of the following stage becomes higher than the source voltage of the N-MOS FET. If the difference between the input voltage and the source voltage is higher than the threshold voltage of the N-MOS FET in the following stage, the N-MOS FET in the following stage, unexpectedly turns on. This unexpected operation resulted in a malfunctions of the logic circuit.

SUMMARY OF THE INVENTION

The primary object of the present invention is to provide a logic circuit suppressing a malfunctions based on noises superposed on a power voltage.

According to the present invention, there is provided a logic circuit comprising first and second stages of C-MOS circuit made of a first MOS FET of one channel type formed in a semiconductor substrate of one conductivity type and a second MOS FET of another channel type formed in a well region of another conductivity type which is formed in the semiconductor substrate, the output of the first stage being applied to the second stage as its input, a first power terminal applying a first voltage to the semiconductor substrate, a second power terminal applying a second voltage to the well region, the first and second MOS FET's being connected in series between the first and second power terminals, an input terminal receiving an input signal of input pulses, and a pulse converter inserted between the input terminal and the first stage, the pulse converter converting the input signal into a signal having a reference voltage of the second voltage and pulses of the first voltage generaling in accordance with the input pulses with a shorter width than the input pulses.

The logic circuit according to the present invention has the pulse converter for applying small-width pulses having a reference voltage of the second voltage to the first stage of the C-MOS circuit. The time period when the first stage of the C-MOS circuit receives the second voltage as the input is longer than the time period when the first stage receives the first voltage. In other words, the time period when the output of the first stage is at the first voltage is longer than the time period when the output of the first stage is at the second voltage. When the output of the first stage is at the first voltage, the source voltages of the first MOS FET's in the first and second stages keep the voltage at the first terminal even if the noises superpose on the first voltage. This is because the resistance based on the semiconductor substrate between the sources and the first terminal are small. Therefore, there is not produced a voltage difference between the output of the first stage and the source voltage of the first MOS FET in the second stage by the application of noises to the first terminal to keep the first transistor in the second stage off, resulted in no malfunction. If the noise is applied to the second terminal when the output of the first stage is at the first voltage, there is not produced a voltage change in the output of the first voltage, and no malfunction is caused.

Although there is a chance of malfuntion during the time period when the input of the first stage is at the first voltage, such time period is very small. Therefore, the logic circuit of the present invention is hard to produce a malfunction by the noises superposed on power voltages.

BRIEF DESCRIPTION OF THE DRAWINGS

The above and further objects, features and advantages of the present invention will become more apparent from the following detailed description taken in conjunction with the accompanying drawings, wherein.

Figure 1:
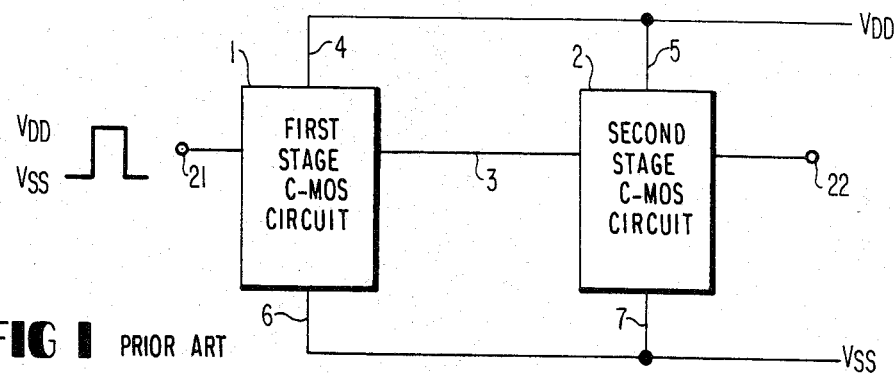
FIG. 1 is a block diagram of logic circuit in the prior art.

One example of the logic circuits in the prior art is shown in FIG. 1 in a form of block diagram. An input signal of pulses is applied to an input terminal 21 and then applied to a first stage 1 of C-MOS circuit. An output of the first stage 1 is applied to a second stage 2 of C-MOS circuit through a signal line 3. An output of the second stage 2 is produced at an output terminal 22. The first and second stages 1 and 2 are made of a series circuit of P- and N-MOS FET's connected between power terminals 4 and 5 to receive a power voltage $V_{DD}$ and power terminals 6 and 7 to receive a power voltage $V_{SS}$. Gates of the P- and N-MOS FET's are commonly connected to serve as an input node. Drains of the P- and N-MOS FET's are commonly connected to serve as an output node. Sources of the P- and N-MOS FET's are respectively connected to the power terminals 4 and 5 and the power terminal 6 and 7.

Figure 2:
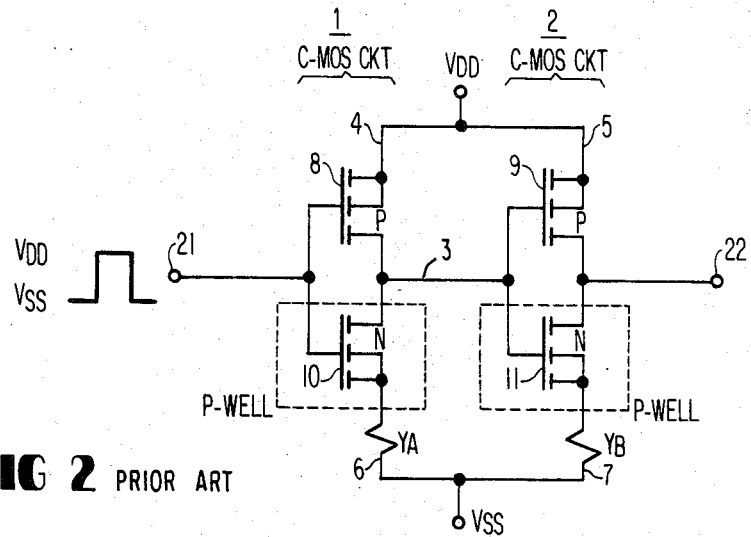
FIG. 2 is a circuit diagram of logic circuit in the prior art.

The above-explained structure can be expressed as a circuit diagram of FIG. 2. In the first stage 1, a P-MOS FET 8 and an N-MOS FET 10 are connected in series. In the second stage 2, a P-MOS FET 9 and an N-MOS FET 11 are connected in series. Generally, the C-MOS circuit is formed in an N-type silicon substrate. While the P-MOS FET's 8 and 9 are directly formed in the N-type silicon substrate, the N-MOS FET's 10 and 11 are formed in one or two P-wells which is diffused in the N-type silicon substrate. The P-wells have thin thickness compared to the silicon substrate to provide a resistance component in a lateral direction. Furthermore, the application of power voltage to the P-well is made on the surface. Therefore, resistance components of the P-wells between the source of the N-MOS FET 10 and the power terminal 6 and between the source of the N-MOS FET 11 and the power terminal 7 are added to the C-MOS circuits as resistors $\gamma_A$ and $\gamma_B$. The application of power voltage to the silicon substrate is on the backsurface. Although the resistance components of the silicon substrate in the vertical direction are inserted between the source of the P-MOS FET 8 and the power terminal 4 and between the source of the P-MOS FET 9 and the power terminal 5, the resistances of such resistance components are negligible. The circuit operation is dominantly affected by the resistance components of P-wells.

The affection on the circuit operations will be explained. It is assumed that an input signal has a reference voltage of the power voltage $V_{SS}$ and input pulses having a voltage of the power voltage $V_{DD}$ and that the resistance of the resistor $\gamma_A$ is larger than the resistance of the resistor $\gamma_B$. When the input signal is at the reference voltage or the power voltage $V_{SS}$, the P- and N-MOS FET's 8 and 10 respectively turn on and off to raise the voltage at the signal line 3 up to the power voltage $V_{DD}$. The P- and N-MOS FET's 9 and 11 respectively turn off and on. Under such condition, the source voltage of the P-MOS FET 8, that is, the voltage at the signal line 3 keeps at the voltage at the power terminal 4, even if noises are superposed on the power voltage $V_{DD}$. This is because the resistance based on the silicon substrate is negligible. The source voltage of the P-MOS FET 9 is similarly kept at the voltage at the power terminal. Therefore, the P-MOS FET 9 keeping an off condition does not turn on by noises superposed on the power voltage $V_{DD}$.

Next, when the pulse of the power voltage $V_{DD}$ is applied to the input terminal 21, the P- and N-MOS FET's 8 and 10 respectively turn off and on to lower the voltage at the signal line 3 to the power voltage $V_{SS}$. The P- and N-MOS FET's 9 and 11 respectively turn on and off. Under this condition, if the power voltage $V_{SS}$ suddenly lowers by a noise, the source voltage of the N-MOS FET 10 temporarily becomes higher than the source voltage of the N-MOS FET 11 in the transient time, due to the resistance $\gamma_A$ and $\gamma_B$. This makes the voltage at the signal line 3 higher than the source voltage of the N-MOS FET 11 to produce a gate-source voltage difference. If the gate-source voltage difference is larger than the threshold voltage of the N-MOS FET 11, the N-MOS FET 11 accidentially turns on to lower the voltage at the output terminal 22. This accidental turning-on of the N-MOS FET 11 is a cause of malfunction of logic circuit connected to the output terminal 22. Here, if a noise is superposed on the power voltage $V_{DD}$ under the same condition, P- and N-MOS FET's 9 and 11 do not change their operational conditions, because the signal line 3 is at the power voltage $V_{SS}$.

DESCRIPTION OF THE PREFERRED EMBODIMENT

Figure 3:
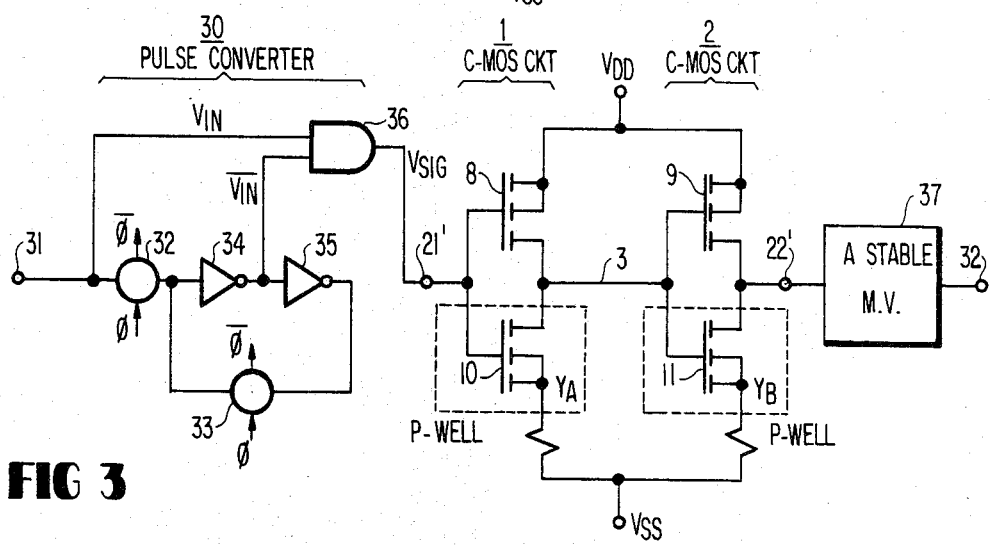
FIG. 3 is a circuit diagram of logic circuit according to one embodiment of the present invention.
Figure 4:
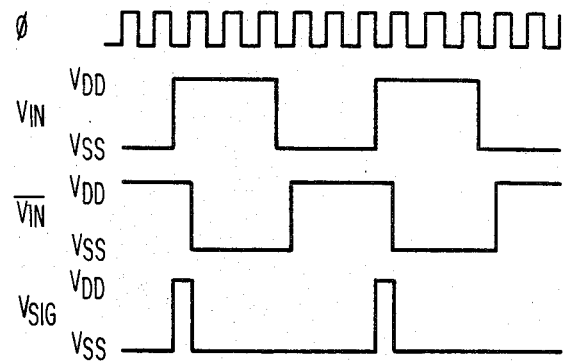
FIG. 4 shows waveforms to illustrate the operation of the pulse converter used in the embodiment shown in FIG. 3.

The preferred embodiment of the present invention will be explained with reference to FIGS. 3, 4 and 5. The cascade connection of the first and second stages 1 and 2 of C-MOS circuit is similar to those shown in FIG. 2. The input terminal 31 receives an input signal $V_{in}$ (see FIG. 4) which is a signal similar to the input signal in the prior art. The input signal $V_{in}$ is converted by a pulse converter 30 into a signal having a reference voltage of the power voltage $V_{SS}$ and short pulses of the power voltage $V_{DD}$, and then applied to the first stage 1 of C-MOS circuit. The pulse converter 30 consists of two transmission gates 32 and 33, two inverters 34 and 35 and a two-input AND gate 36. The transmission gates 32 and 33 are made of parallel connected P- and N-MOS FET's having gates receiving clock pulses $\phi$ and $\bar{\phi}$, respectively. The two inverters 34 and 35 and the transmission gate 33 form a closed loop. The AND gate 36 receives the input signal $V_{in}$ from the input terminal 31 and the inverted input signal $\bar{V}_{in}$ from the signal line between the inverters 34 and 35. The AND gate 36 produces a signal $V_{sig}$ which has a reference voltage of the power voltage $V_{SS}$ and signal pulses in synchronism with the leading edge of the input signal $V_{in}$. The signal pulses have the same pulse width as the clock pulses $\phi$ and $\bar{\phi}$ and a voltage of the power voltage $V_{DD}$. According to one example, the power voltages $V_{DD}$ and $V_{SS}$ are respectively selected at 0 volt and $-1.5$ volts, and the pulse width of the signal pulses is 15.625 microseconds. The shoter is the pulse width of the signal pulses, the smaller is the opportunity of maloperation of the logic circuit. The narrower limit of the pulse width is determined by the operating speed of the MOS FET's 8 to 11 and is longer than 100 nanoseconds. The longer limit is 100 microseconds. Preferably, the width of the converted pulses are selected in the range between 15 and 60 microseconds.

The signal $V_{sig}$ converted by the pulse converter 10 is applied to the first stage 1 through the terminal 21' and then applied to the second stage 2 through the signal line 3. The output from the second stage may be processed in the following logic circuit (not shown in FIG. 3) connected to the terminal 22'. In the case where the normal pulse signal or wide width pulses are demanded as the output signal, the output from the second stage 2 is once applied to an astable multi-vibrator 37 and then produced a desired output pulse signal at the output terminal 32.

Figure 5:
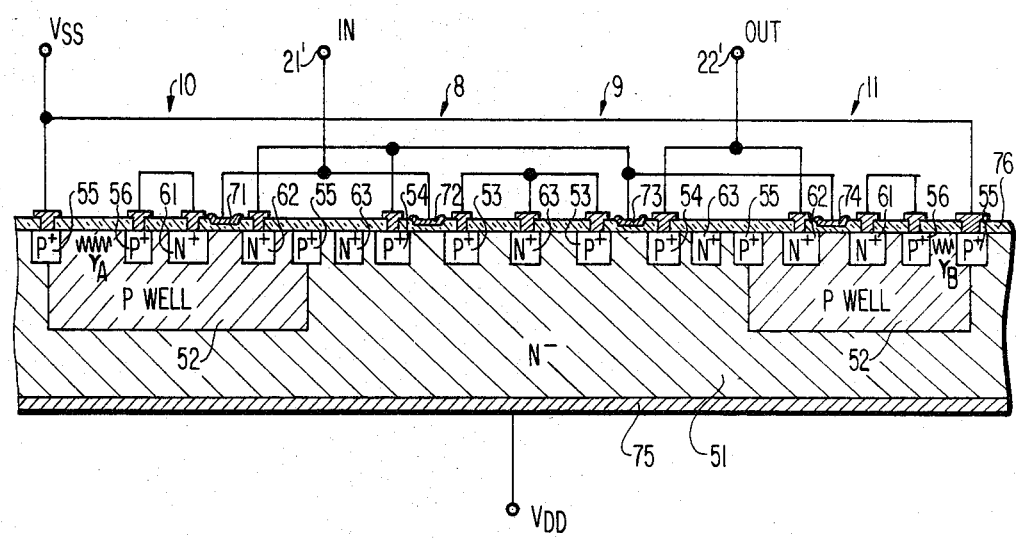
FIG. 5 is a sectional diagram of C-MOS circuit formed in an integrated circuit, which is used in the embodiment shown in FIG. 3.

The first and second stages 1 and 2 of C-MOS circuit are formed on an N-type silicon substrate 51 having an impurity concentration of $1 \times 10^{15}$ cm$^{-3}$ as shown in FIG. 5. The P-MOS FET's 8 and 9 consist of P+-type source regions 53, P+-type drain regions 54 and gate electrodes 72 and 73 formed on the insulator film 76 between the P+-type regions 53 and 54. The P+-type source regions 53 are connected through a wiring to an N+-type region 63 which functions as channel stoppers. Through the N+-type region 63 and the wiring, the P+-type source regions 53 receives the power voltage $V_{DD}$ applied to a metal layer 75 on the back surface of substrate 51. The P+-type source and drain regions 53 and 54 have an impurity concentration of $1 \times 10^{19}$ cm$^{-3}$ and N+-type region 63 has $1 \times 10^{20}$ cm$^{-3}$. The substrate 51 further comprises P-well regions 52 having an impurity concentration of $1 \times 10^{16}$ cm$^{-3}$ in which the N-MOS FET's 10 and 11 are formed. The N-MOS FET's 10 and 11 consist of N+-type source regions 61, N+-type drain regions 62 and gate electrodes 71 and 74 disposed on the insulator film 76 between the N+-type source and drain regions 61 and 62. The N+-type source regions 61 are connected to P+-type regions 56 through wirings. At the interface between the P-well regions 52 and the substrate 51, there are provided P+-type regions 55 receiving the power voltage $V_{SS}$ and functioning as channel stoppers. The power voltage $V_{SS}$ is applied to the P+-type source regions 56 through resistance components ($\gamma_A$ and $\gamma_B$) of the P-well regions 52. The N+-type source and drain regions 61 and 62 have an impurity concentration of $1 \times 10^{20}$ cm$^{-3}$ and the P+-type region has $1 \times 10^{19}$ cm$^{-3}$. The gate electrodes 71 and 72 are commonly connected to the terminal 21'. The N+-type drain region 62 of the N-MOS FET 10 and the P+-type drain region 54 of the P-MOS FET 8 are connected to the gate electrodes 73 and 74 through a wiring as the signal line 3. The P+-type drain region 54 of the P-MOS FET 9 and the N+-type drain region 62 of the N-MOS FET 11 are commonly connected to the terminal 22'.

The operation of the above-explained embodiment will now be disclosed. Now it is assumed that the resistance $\gamma_A$ in the first stage 1 is larger than the resistance $\gamma_B$ in the second stage 2. Such condition frequently appears on semiconductor integrated circuits. For example, if the distance from the P+-type region 55 to the P+-type region 56 near the N-MOS FET 10 is longer than that near the N-MOS FET 11, the above-assumed condition appears.

When the signal $V_{sig}$ at the terminal 21' is at the reference voltage of the power voltage $V_{SS}$, the P- and N-MOS FET's 8 and 10 turn respectively on and off to raise the voltage at the signal line 3 up to the power voltage $V_{DD}$ and to turn the P- and N-MOS FET's 9 and 11 off and on, respectively. Under this condition, even if noises superposed on the power voltage $V_{DD}$, the source voltage of the P-MOS FET 8 keeps at the same voltage as the power voltage $V_{DD}$, because the resistance component of the substrate 51 between the metal layer 75 and the N+-type region 63 is negligibly small. Therefore, the voltage at the signal line 3 keeps at the same voltage as the power voltage $V_{DD}$, resulting in no change of operating condition of the P-MOS FET 9. In other words, even if the noises are applied to the power voltage, the P-MOS FET 9 keeps its off condition.

On the other hand, if the noises are applied to the power voltage $V_{SS}$, the voltage at the signal line 3 is not affected by the noise, because the P-MOS FET 8 is in an on condition. Further, since the gate electrode of the N-MOS FET 11 is at the power voltage $V_{DD}$, noises cannot turn the N-MOS FET 11 off. Thus, any noise cannot change the operating conditions of the P- and N-MOS FET 9 and 11. The C-MOS circuit does not generate any malfunction.

Next, when the signal $V_{sig}$ at the terminal 21' is at the power voltage $V_{DD}$, the P- and N-MOS FET's 8 and 10 turn respectively off and on to lower the voltage at the signal line 3 to the power voltage $V_{SS}$ and to turn the P- and N-MOS FET's 9 and 11 on and off, respectively. If the power voltage $V_{SS}$ drops by a noise, the source voltage of the N-MOS FET 10 temporarily becomes higher than the source voltage of the N-MOS FET 11 by the resistor $\gamma_A$ which has a resistance larger than the resistor $\gamma_B$. As a result, the gate voltage becomes higher than the source voltage of the N-MOS FET 11. If the gate voltage is higher than the source voltage by more than the threshold voltage of the N-MOS FET 11, the N-MOS FET 11 accidentally turns on, resulting in a malfunction of the C-MOS circuit. It is noted that, if noises are applied to the power voltage $V_{DD}$, the P-MOS FET 9 keeps its on condition, because the voltage at the signal line 3 is at the power voltage $V_{SS}$ and the noise cannot make the source voltage of the P-MOS FET 9 low to turn it off.

As explained above, when the signal $V_{sig}$ at the terminal 21' is at the reference voltage of the power source $V_{SS}$, the C-MOS circuit does not generate any malfunction by noises. Although the C-MOS circuit may produce a malfunction by noise when the signal $V_{sig}$ is at the power voltage $V_{DD}$, the time period when the signal $V_{sig}$ is at the power voltage $V_{DD}$ is very short compared to the time period when the signal $V_{sig}$ is at the reference voltage of the power voltage $V_{SS}$. Therefore, the possibility of malfunction is very low.

In the above, one embodiment is explained by use of P-MOS FET's formed in N-type silicon substrate and N-MOS FET's formed in P-well regions. All the conductivity types may be interchanged with a change of polarities of the power voltages. In such modification, too, the converted signal should have a reference voltage of the power voltage applied to a well region formed in a semiconductor substrate.

What is claimed is:

1. A logic circuit comprising:
   an input terminal receiving an input terminal of input pulses;
   first and second stages each having an input node and an output node and having a circuit of a first MOS transistor of one channel type formed in a semiconductor substrate of one conductivity type and a second MOS transistor of another channel type formed in a well region of another conductivity type which is formed in said semiconductor substrate, and said output node of said first stage being connected to said input node of said second stage;
   a first power terminal applying a first power voltage to said semiconductor substrate;
   a second power terminal applying a second power voltage to said well region said first and second MOS transistors in each of said first and second stages being connected in series between said first and second power terminals; and
   a first pulse converter connected between said input terminal and said input node of said first stage, said first pulse converter shortening the pulse width of said pulse input signal; and
   a second pulse converter receiving a signal from said output node of said second stage and widening the pulse width of the received signal.

2. A logic circuit as claimed in claim 1, wherein said first and second MOS transistors have a source electrode, a drain electrode and a gate electrode, respectively, said source and drain electrodes of said first and second MOS transistors being connected and said gate electrodes of said first and second MOS transistors in each of said first and second stages being commonly connected to said input nodes to form inverters.

3. The logic circuit as claimed in claim 1, wherein said first and second MOS transistors in each of said first and second stages are connected to each other to form inverters.

4. A logic circuit as claimed in claim 1, wherein said one conductivity type is an N-type, said other conductivity type is a P-type, said one channel type is a P-channel type and said other channel type is an N-channel type.

5. A logic circuit as claimed in claim 1, wherein said first pulse converter comprises a first transmission gate driven with a clock pulse and an inverted clock pulse, a first inverter connected to said first transmission gate, a second inverter connected to said first inverter, a second transmission gate connected between said second inverter and an interconnection point between said first transmission gate and said first inverter, said second transmission gate being driven with said inverted clock pulse and said clock pulse and an AND gate receiving signals at the input and output of said first inverter.

6. A logic circuit as claimed in claim 1, wherein the pulse width of said pulse input signal is shortened to have a width between 100 nanoseconds and 100 microseconds.

7. A logic circuit as claimed in claim 6, wherein the pulse width of said pulse input signal is shortened to have a width between 100 microseconds and 60 microseconds.

8. A logic circuit comprising:
an input terminal receiving a pulse input signal;
a first power terminal receiving a first power voltage;
a second power terminal receiving a second power voltage;
first and second inverters connected in cascade, each of said first and second inverters having an input node and an output node and including a first field effect transistor of a first channel type formed in a semiconductor substrate, each of said first and second field effect transistors having a source, a drain and a gate, the source of said first field effect transistor being connected to said first power terminal through said semiconductor substrate, the drains of said first and second field effect transistors being connected to said output node, the gates of said first and second field effect transistors being connected to said input node, and the source of said second field effect transistor being connected to said second power terminal through said well region; and
a first pulse converter connected between said input terminal and said input node of said first inverter, said pulse converter shortening the pulse width of said pulse input signal; and
a second pulse width converter receiving a signal from said output node of said second stage, said second pulse width converter widening the pulse width of the received signal.

9. A logic circuit as claimed in claim 8, wherein said semiconductor substrate is a N-type, said well region is a P-type, said first field effect transistor is a P-channel MOS transistor and said second field effect transistor is an N-channel MOS transistor.

10. A logic circuit as claimed in claim 8, wherein said semiconductor substrate is an N-type, said well region is a P-type, said first field effect transistor is a P-channel MOS transistor and said second field effect, transistor is an N-channel MOS transistor.

11. A logic circuit as claimed in claim 8, wherein said shortened pulse width has a width between 100 nanoseconds and 100 microseconds.

12. A logic circuit as claimed in claim 11, wherein said shortened pulse width has a width between 10 microseconds and 60 microseconds.

13. A logic circuit comprising:
a semiconductor substrate of one conductivity type;
at least one well region of another conductivity type formed in said semiconductor substrate;
a first power terminal applying a first power voltage to said semiconductor substrate;
a second power terminal applying a second power voltage to said well region;
an input terminal receiving a pulse input signal;
first and second stages each having an input node and an output node and having a circuit of a first MOS transistor of one channel type formed in said semiconductor substrate and a second MOS transistor of another channel type formed in said well region, said first and second MOS transistors in said first stage being connected in series between said first and second power terminals through a first resistance component of said well region, said first and second MOS transistors in said second stage being connected in series between said first and second power terminals through a second resistance component of said well region which is smaller than said first resistance component, said output node of said first stage being connected to said input node of said second stage; and
a pulse converter connected between said input terminal and said input node of said first stage, said pulse converter shortening the pulse width of said pulse input signal.

14. A logic circuit as claimed in claim 13, wherein each of said first and second MOS transistors has a source electrode, a drain electrode and a gate electrode, said gate electrodes of said first and second MOS transistors in each of said first and second stages are commonly connected to the input node of each stage, said drain electrodes of said first and second MOS transistors in each of said first and second stages commonly connected to the output node of each stage.

15. A logic circuit as claimed in claim 13, wherein said one conductivity type is an N-type, said other conductivity type being a P-type, said one channel type being a P-channel type and said other channel type being an N-channel type.

* * * * *

UNITED STATES PATENT AND TRADEMARK OFFICE
CERTIFICATE OF CORRECTION

PATENT NO. : 4,670,672

DATED : June 2, 1987

INVENTOR(S) : Tsuyoshi Ando, et al

It is certified that error appears in the above-identified patent and that said Letters Patent is hereby corrected as shown below:

Column 4, Line 46, Delete "shoter" insert --shorter--

Column 6, Line 5, After "$V_{DD}$" delete "."

Column 6, Line 7-8, Delete italic print

Column 6, Line 44, Delete second occurance of "terminal"
Claim 1            insert --signal--

Signed and Sealed this

Sixteenth Day of August, 1988

*Attest:*

DONALD J. QUIGG

*Attesting Officer*   *Commissioner of Patents and Trademarks*